US006040001A

United States Patent [19]
Paek et al.

[11] Patent Number: 6,040,001
[45] Date of Patent: Mar. 21, 2000

[54] METHOD OF MANUFACTURING A DIAMOND VACUUM DEVICE

[75] Inventors: Mun Cheol Paek; Sung Woo Choi; Kee Soo Nam, all of Daejon-Shi, Rep. of Korea

[73] Assignee: Electronics and Telecommunications Research Institute, Daejeon, Rep. of Korea

[21] Appl. No.: 09/136,614

[22] Filed: Aug. 20, 1998

[30] Foreign Application Priority Data

Sep. 18, 1997 [KR] Rep. of Korea ...................... 97-47535

[51] Int. Cl.[7] ............................... B05D 5/12; C23C 16/00

[52] U.S. Cl. ......................... 427/78; 427/249.9; 427/250; 427/255.27; 427/255.7

[58] Field of Search .................................... 427/78, 249.9, 427/250, 255.7, 255.27

[56] References Cited

U.S. PATENT DOCUMENTS 5,478,650 12/1995 Davanloo et al. .

OTHER PUBLICATIONS

S. Zurn, Q. Mei, C. Ye, T. Tamagawa and D.L. Polla; Sealed Vacuum Electronic Devices by Surface Micromachining; 1991; pp. 205–208.

*Primary Examiner*—Roy V. King
*Attorney, Agent, or Firm*—Anotnelli, Terry, Stout & Kraus, LLP

[57] ABSTRACT

This invention discloses a method of manufacturing a diamond vacuum device, and more particularly a method of manufacturing a diamond vacuum device which uses a diamond thin film as an electron emitter by electric field. The present invention presents a method of manufacturing a vacuum device for use in high speed, high voltage, using diamond having a negative electron affinity, which can emit electrons even at a low voltage and is also resistant to chemical variations.

3 Claims, 2 Drawing Sheets

METHOD OF MANUFACTURING A DIAMOND VACUUM DEVICE

BACKGROUND OF THE INVENTION

1. Field of the Invention

The present invention relates to a method of manufacturing a diamond vacuum device, and more particularly to a method of manufacturing a diamond vacuum device which uses a diamond thin film for the purpose of emitting electrons by electric field.

2. Description of the Prior Art

A vacuum device is a device in which a vacuum tube is implemented by a micro semiconductor technology. A typical vacuum device uses a refractory metal such as tungsten or titanium etc. as an emission tip of electron. However, since the electron emission work function of this metal is usually the range of 4.0 eV and 5.0 eV, in order for the metal to emit electrons, it has to be heated or to be applied with a high voltage more than the rane of several tens or hundred volts. Therefore, it is difficult to reduce the size of the device to the extent that it can be mounted on a semiconductor chip and also it is difficult to obtain as expected. Also, in most case, since the anode, gate and cathode from which electrons are emitted are arranged in a vertical direction, it provides advantages that electrons are emitted uniformly therefrom and a cylindrical symmetric structure is obtained. However, there are disadvantages that it accompanies a complicated process and also requires a precise apparatus and control technology, thus causing an increased manufacturing cost and a lower throughput.

SUMMARY OF THE INVENTION

The present invention presents a method of manufacturing a vacuum device which is suitable to a high speed, high power signal processing and also can be effectively utilized under circumstances of high temperature or a chemical harshness, compared to the conventional solid state transistor.

The present invention is characterized in that it uses a diamond as an electron emitter, adopts an electron flow method of horizontal structure and makes respective electrons under a vacuum state. In other words, the present invention uses a conventional vacuum tube which is finely reduced using a semiconductor process technology and micromachining, thus causing no parasitic capacitance effects due to electron flow directly from cathode to anode at a vacuum state and and thereby embodying a vacuum device which makes a high speed processing possible due to little head produced therein. Therefore, the device according to the present is expected to be used for a high speed, large capacity of communication signal processing.

It is an object of the present invention to solve the problems involved in the prior art, and to provide a high efficiency vacuum device capable of processing signal at a high speed without heat generation or parasitic capacitance because it uses a low power.

To achieve the above object, the method of manufacturing a diamond vacuum device is characterized in that it comprises, after forming a silicon oxide film on a silicon substrate through oxidation process, depositing a polysilicon wiring layer and then patterning it into an cathode shape; depositing a diamond thin film on said polysilicon wiring layer through selective deposition method to form a diamond cathode; after depositing a refractory metal thin film on said silicon oxide film and then patterning it to form gates and anode, wherein said gates are formed at symmetric positions each other right and left with respect to the electron emission direction of said diamond cathode, and said anode is formed at the electron emission direction of said diamond cathode; forming a photosensitive pattern on the outside of the entire surface of the structure and then etching the exposed silicon oxide film therein, wherein said etching is performed up to a silicon oxide film below said diamond cathode, said gate and said anode, thus maintaining said diamond cathode, said gate and the anode to be in space; after removing said photosensitive pattern, using an inverse mask pattern to fill a photosensitive film within said space; depositing a silicon oxide film on the entire surface of the structure including said photosensitive film filled within said space and vacuum packaging it, wherein an outlet is formed at the anode portion; and after removing said photosensitive film filled within said space through said outlet, using a silicon oxide film again to vacuum-seal said outlet.

BRIEF DESCRIPTION OF THE DRAWINGS

The above object, and other features and advantages of the present invention will become more apparent by describing the preferred embodiment thereof with reference to the accompanying drawings, in which.

Similar reference characters refer to similar parts in the several views of the drawings.

DETAILED DESCRIPTION OF PREFERRED EMBODIMENT

The present invention will be explained in detail below by reference to the accompanying drawings.

FIGS. 1*a* through 1*e* show plane views for explaining a method of manufacturing a diamond vacuum device according to the present invention, and FIGS. 2*a* through 2*e* show sectional view taken along lines A—A of FIG. 1*a* through 1*e*, respectively.

Figure 1A:
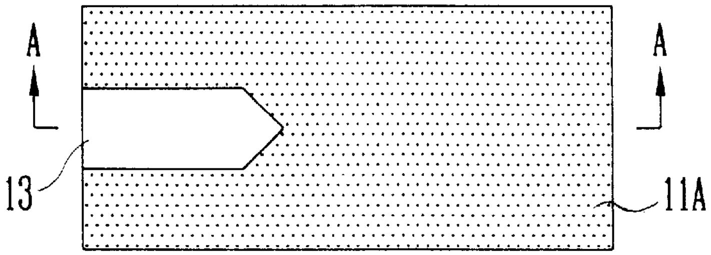
FIGS. 1*a* through 1*e* show plane views for explaining a method of manufacturing a diamond vacuum device according to the present invention.
Figure 1B:
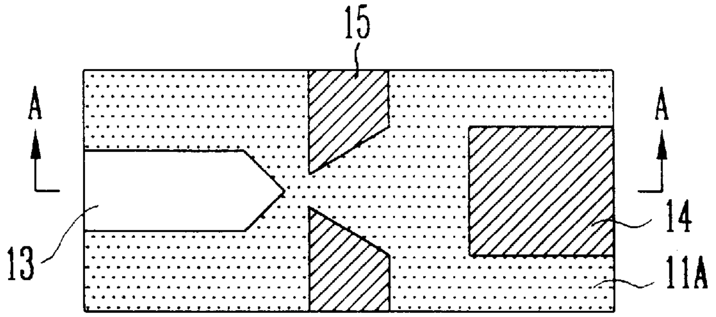
Figure 2A:
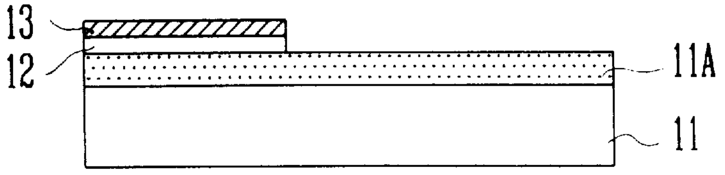
FIGS. 2*a* through 2*e* show sectional views taken along lines A—A of FIG. 1*a* through 1*e*, respectively.

As shown in FIG. 2*a*, after a silicon oxide ($SiO_2$) film A—A is formed on a silicon substrate 11 through an oxidation process, a n-type polysilicon wiring layer 12 of a high dopant concentration is deposited thereon. Then, after the polysilicon wiring layer 12 is patterned like an cathode shape to be formed, a diamond thin film is selectively deposited on the polysilicon wiring layer 12. Through an etching process using fluoride acid, the remaining diamond thin film deposited other than on the polysilicon wiring layer 12 is removed to form a diamond cathode 13, as shown in FIG. 1*a*. At this time, the polysilicon wiring layer 12 enhances contact between the cathode 13 and the silicon oxide film 11A and also acts as an electron wiring of the cathode 13. That is, as diamond is not so well deposited on a silicon oxide film, a polycrystal silicon not a single crystal is used to aid diamond to grow into a nano-crystalline phase.

After the cathode 13 is formed, a refractory metal such as titanium or tungsten etc. which has a good high temperature resistant and a corrosive-resistant is deposited and then masked to form gates 15 and a anode 14 of a shape as shown in FIG. 1(*b*). In other words, the gates 15 metals are formed to be located symmetrically with respect to the electron emission direction of the diamond cathode 13, which provides a high rate of electron emission, high reliability of device and a high stability. In the above process, the gate 15 the refractory metal thin film for anode 14 are deposited by about several μm so that they can maintain a sufficient strength even without support of a substrate. The gate 15 as shown in the sectional view of FIG. 2b indicates a gate 15 formed backwardly from the section.

Figure 1C:
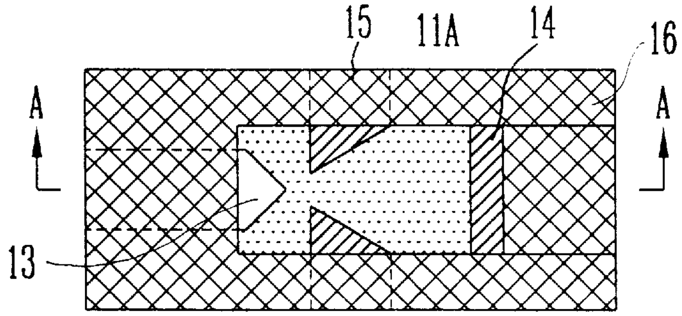

As described above, after the gate 15 and the anode 14 are formed at the same time, in order to form a vacuum device, a photosensitive film 16 is formed on the entire surface of the structure, as shown in FIG. 1*c*. Then, the silicon oxide film 11A is wet etched using the photosensitive film 16 as a mask, as shown in FIG. 2*c*. At this time, by sufficiently etching the silicon oxide film 11A, the diamond cathode 13, the polysilicon wiring layer 12, the gate 15 and the anode 14 are all kept over a space.

Figure 2B:
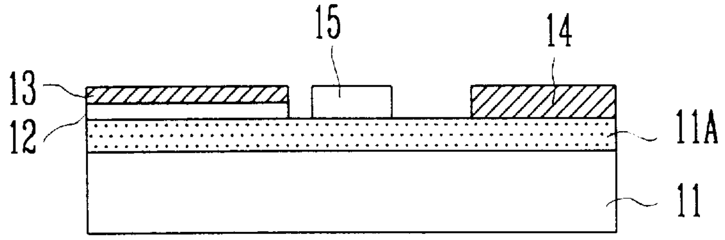
Figure 2C:
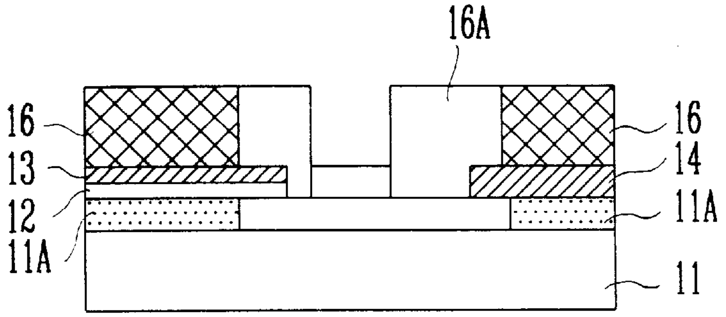

As can be seem from FIG. 2*c,* there is a gate 15 formed backwardly from the section similarly to FIG. 2*b,* wherein the photosensitive film 16A except for the photosensitive film 16 which is seen as a cut section is formed on the outside of the entire structure, as shown in FIG. 1*c,* thus making it seen as if it is formed in the rear face.

Figure 1D:
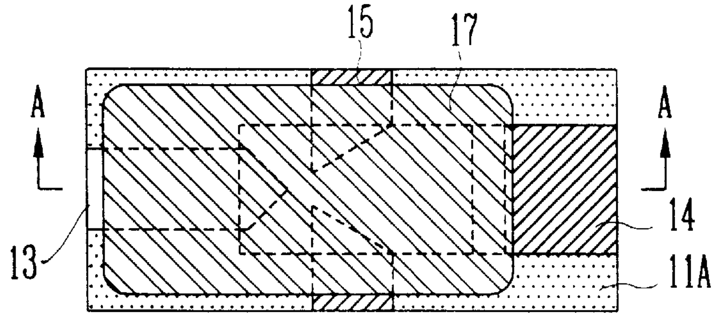
Figure 2D:
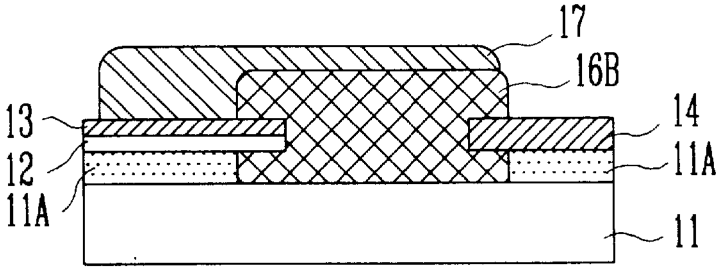

The method of vacuum-packaging the space formed as above is shown in FIG. 2*d.* After the photosensitive film 16 in FIG. 2*c* is removed, a photosensitive film 16A is filled within the space formed during the above etching process of the silicon oxide film 11A using an inverse mask of a same shape, as shown in FIG. 2*d.* That is, after the photosensitive film 16B is filled within the space in which the diamond cathode 13, the polysilicon wiring layer 12, the gate 15 and the anode 14 are kept over, a silicon oxide film 17 is deposited on the entire surface of the structure, thus completing a vacuum package of it, as shown in FIG. 1d. At this time, portions of the silicon oxide film 17 for vacuum package, which is deposited at the anode 14, are etched to form an outlet so that the photosensitive film 16B can be removed therefrom during a subsequent process. The outlet is shown in FIG. 2*d.*

Figure 1E:
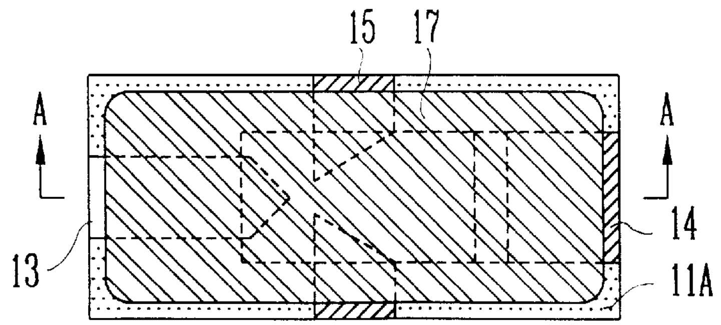
Figure 2E:
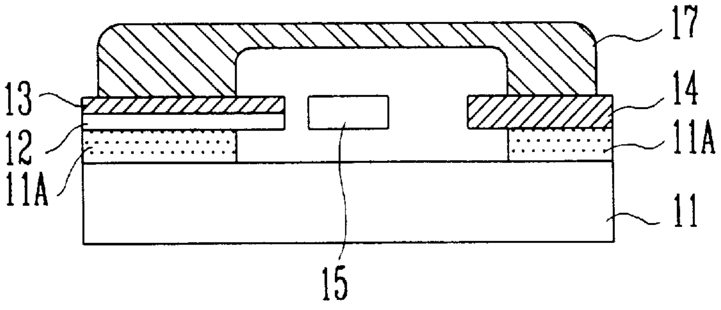

The photosensitive film 16B which has been contained in the internal space can be removed through the outlet formed as above by means of wet etching method. Then, as shown in FIG. 1*e,* the silicon oxide film 17 is thickly deposited and completely sealed. At this time, the process of depositing the silicon oxide film 17 is performed under vacuum, so that the internal space of the device can be vacuumed as shown in FIG. 2*e.*

As described above, according to the present invention, the work function of electron emission is significantly lowered compared to that of a typical metal by use of diamond as cathode material from which electrons are emitted, and more particularly as the cathode of diamond has a negative electron affinity, it emits a high current even when being applied with a low voltage. In addition, since it has a high hardness, and a chemical-resistant and corrosive-resistant property, it can be used permanently since it does not generate a heat.

From the foregoing, the present invention can increase the emission efficiency of electrons, and reliability and stability of the device by adopting a structure in which a gate electrode is symmetrically positioned at the right and left of the anode so that the electrons can flow horizontally. In addition, it can provides advantages that it can reduce the manufacturing cost since it can implement the operation of the vacuum tube as it is, by adopting a structure in which a silicon oxide film is first deposited and a photosensitive material is then removed so that the anode, the gate and the cathode are all kept over a space.

While the present invention has been described and illustrated herein with reference to the preferred embodiment thereof, it will be understood by those skilled in the art that various changes in form and details may be made therein without departing from the spirit and scope of the invention.

What is claimed is:

1. A method of manufacturing a diamond vacuum device, comprising the steps of:

after forming a silicon oxide film on a silicon substrate through an oxidation process, depositing a polysilicon wiring layer thereon and patterning said polysilicon wiring layer into an anode shape;

depositing a diamond thin film on said polysilicon wiring layer through a selective deposition method to form a diamond cathode;

depositing a refractory metal thin film on said silicon oxide film and then patterning said refractory metal thin film to form gates and anode, wherein said gates are formed at right and left sides of the electron emission direction of said diamond cathode, and said anode is formed at the electron emission direction of said diamond cathode;

forming a photosensitive pattern on the outside of the entire structure after forming said gates and anode and etching the exposed silicon oxide film therein, wherein said etching is performed up to a silicon oxide film below said diamond cathode, said gate and said anode, thus floating said diamond cathode, said gate and the anode in a space;

removing said photosensitive pattern, and filling a photosensitive film within said space by an inverse mask pattern;

depositing a silicon oxide film on the entire structure including said photosensitive film filled within said space to package in vacuum, wherein an outlet is formed at a portion of said anode; and removing said photosensitive film filled within said space through said outlet and sealing in vacuum said outlet using a silicon oxide film.

2. A method of manufacturing a diamond vacuum device as claimed in claim 1, wherein said polysilicon wiring layer is a polysilicon doped with n-ions of a high concentration, and said refractory metal thin film is formed of any one of titanium and tungsten.

3. A method of manufacturing a diamond vacuum device as claimed in claim 1, wherein said refractory metal thin film is deposited by several μm so that a sufficient strength is maintained without support of said substrate.

* * * * *